United States Patent
Yang et al.

(10) Patent No.: US 8,208,269 B2
(45) Date of Patent: Jun. 26, 2012

(54) COMPOSITE STRUCTURE OF ELECTRONIC COMPONENT AND SUPPORTING MEMBER

(75) Inventors: Ming-Tang Yang, Taoyuan Hsien (TW); Wei-Kai Hsiao, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 252 days.

(21) Appl. No.: 12/822,795

(22) Filed: Jun. 24, 2010

(65) Prior Publication Data
US 2010/0328918 A1 Dec. 30, 2010

(30) Foreign Application Priority Data
Jun. 26, 2009 (TW) ................. 98121680 A

(51) Int. Cl.
H05K 7/00 (2006.01)
H01K 1/00 (2006.01)
(52) U.S. Cl. .......... 361/783; 361/760; 439/56; 439/59
(58) Field of Classification Search ............. None
See application file for complete search history.

(56) References Cited

U.S. PATENT DOCUMENTS

| | | | | |
|---|---|---|---|---|
| 4,509,812 A | * | 4/1985 | Lotter | 439/296 |
| 6,036,500 A | * | 3/2000 | Francis et al. | 439/34 |
| 7,633,225 B2 | * | 12/2009 | Yang | 313/512 |
| 7,658,623 B2 | * | 2/2010 | Lee | 439/78 |
| 7,950,840 B2 | * | 5/2011 | Liu et al. | 362/654 |

\* cited by examiner

*Primary Examiner* — Boris Chervinsky
(74) *Attorney, Agent, or Firm* — Kirton McConkie; Evan R. Witt

(57) ABSTRACT

A composite structure includes an electronic component and a supporting member. The electronic component includes a main body and a plurality of pins extended outwardly from the main body. The supporting member includes a first supporting part and a second supporting part. The first supporting part is foldable with respect to the second supporting part. The main body of the electronic component is accommodated within the first supporting part of the supporting member. The pins are accommodated with the second supporting part of the supporting member. The first supporting part is folded with respect to the second supporting part such that the pins are bent to define a bent structure.

20 Claims, 7 Drawing Sheets

COMPOSITE STRUCTURE OF ELECTRONIC COMPONENT AND SUPPORTING MEMBER

FIELD OF THE INVENTION

The present invention relates to a composite structure of an electronic component and a supporting member, and more particularly to a composite structure of a LED package and a supporting member.

BACKGROUND OF THE INVENTION

Conventionally, two approaches are used to mount an electronic component onto a circuit board. In the first approach, the electronic component is mounted on a circuit board according to a surface mount technology (SMT). In the second approach, the pins of the electronic component are inserted into corresponding though-holes of a circuit board and finally soldered on the circuit board through solder paste according to a through-hole technology.

Take a light emitting diode (LED) package for example. Nowadays, the LED package is widely applied to a backlight source or an indicating lamp of an electronic device or an instrument module. FIG. 1 is a schematic exploded view illustrating a LED package to be mounted on a circuit board according to a through-hole technology. As shown in FIG. 1, the LED package 11 comprises a main body 111 and a plurality of pins 112. The pins 112 are extended outwardly from the main body 111. The main body 111 comprises a LED chip 110. The LED chip 110 has an illumination surface 110a. The projecting direction D of the light beams emitted by the LED chip 110 is substantially perpendicular to the illumination surface 110a. The pins 112 are substantially parallel with the projecting direction D of the light beams.

For mounting the LED package 11 on a circuit board 2 according to the through-hole technology, the pins 112 of the LED package 11 are firstly downwardly inserted into corresponding conductive through-holes 20 of the circuit board 2. As such, the projecting direction D of the light beams is substantially perpendicular to the circuit board 2. That is, the light beams are emitted in the direction distant from the circuit board 2. After the pins 112 of the LED package 11 are inserted into corresponding conductive through-holes 20 of the circuit board 2, the pins 112 are fixed on the circuit board 2 through solder paste (not shown). Since the projecting direction D of the light beams fails to be adjusted after the pins 112 are fixed on the circuit board 2, the applications of the LED package 11 are restricted. For example, if the LED package 11 is applied to an indicating lamp of an electronic device, the indicating lamp could be disposed at some positions of the electronic device. Under this circumstance, the layout architectures of the system board and the housing of the electronic device are also dependent on the limited positions of the indicating lamp.

For solving the above drawbacks, the pins 112 of the LED package 11 could be firstly bent by a specified angle and then the LED package 11 is mounted on the circuit board 2. As such, the position of the main body 111 of the LED package 11 and the projecting direction D of the light beams are adjustable according to the layout architectures of the system board and the housing of the electronic device. Since it is difficult to precisely control the bending angle of the pins 112 and the distance between every two adjacent pins 112 is changed after the pins 112 are bent, the pins 112 may fail to be accurately inserted into corresponding conductive through-holes 20 of the circuit board 2. In other words, the process of mounting the LED package 11 on the circuit board 2 usually results in a poor yield, and the LED package 11 fails to be structurally and/or electrically connected with the circuit board 2. Moreover, if the pins 112 have strong elasticity, it is difficult to fix the bending angle of the pins 112. As such, the main body 111 fails to be located at the predetermined position and the projecting direction D of the light beams is readily shifted. Under this circumstance, the performance of the LED package 11 is deteriorated.

Therefore, there is a need of providing a composite structure of an electronic component and a supporting member so as to obviate the drawbacks encountered from the prior art.

SUMMARY OF THE INVENTION

It is an object of the present invention to provide a composite structure of an electronic component and a supporting member, in which the pins could be precisely inserted into corresponding conductive through-holes of the circuit board.

In accordance with an aspect of the present invention, there is provided a composite structure. The composite structure includes an electronic component and a supporting member. The electronic component includes a main body and a plurality of pins extended outwardly from the main body. The supporting member includes a first supporting part and a second supporting part. The first supporting part is foldable with respect to the second supporting part. The main body of the electronic component is accommodated within the first supporting part of the supporting member. The pins are accommodated with the second supporting part of the supporting member. The first supporting part is folded with respect to the second supporting part such that the pins are bent to define a bent structure.

In accordance with another aspect of the present invention, there is provided a supporting member for supporting an electronic component. The electronic component includes a main body and a plurality of pins extended outwardly from the main body. The supporting member includes a first supporting part and a second supporting part. The main body of the electronic component is accommodated within the first supporting part. The pins of the electronic component are accommodated within the second supporting part. The first supporting part is folded with respect to the second supporting part such that the pins are bent to define a bent structure.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
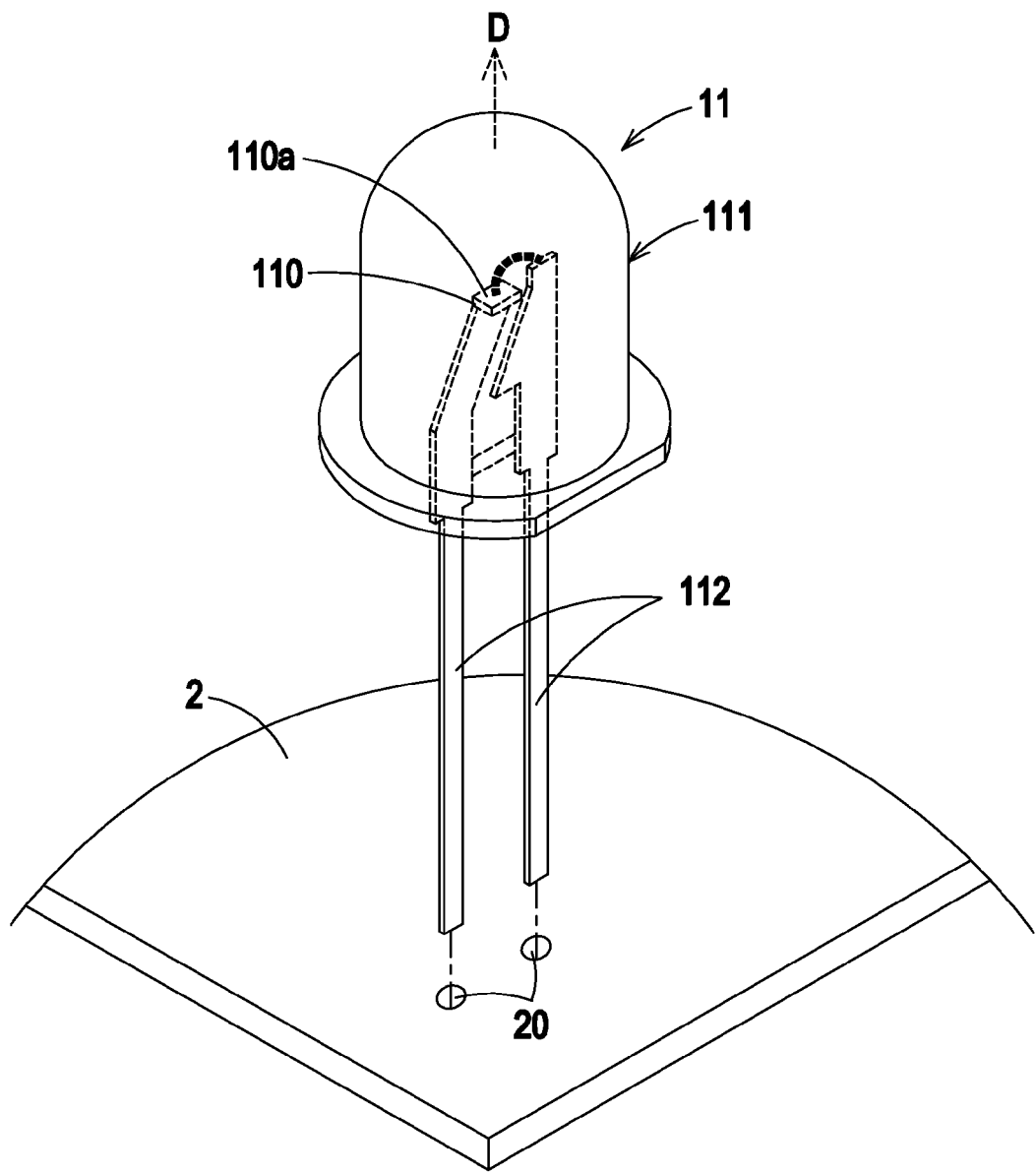
FIG. 1 is a schematic exploded view illustrating a LED package to be mounted on a circuit board according to a through-hole technology.
Figure 2A:
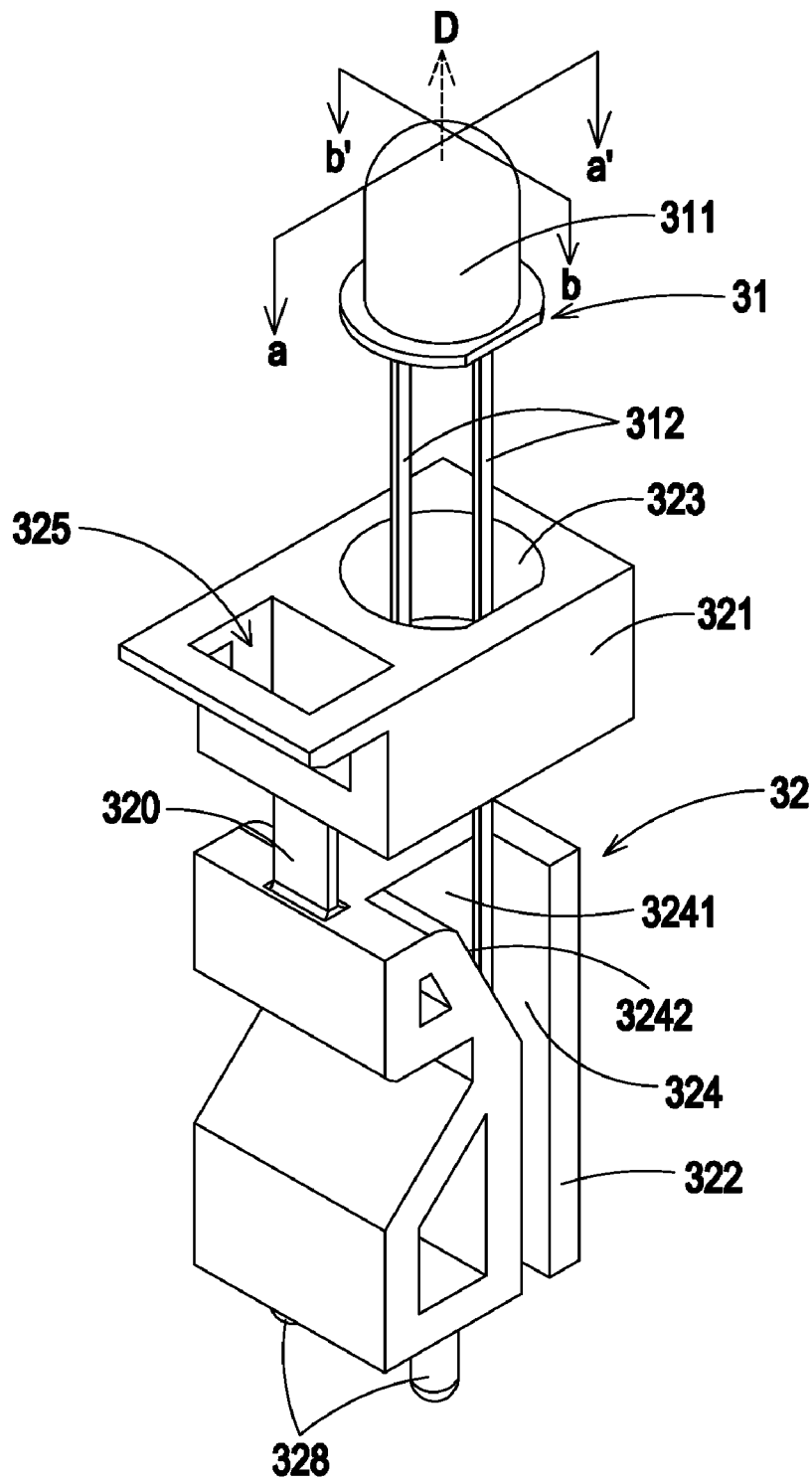
FIG. 2A is a schematic exploded view illustrating a composite structure according to a first embodiment of the present invention.

FIG. 2A is a schematic exploded view illustrating a composite structure according to a first embodiment of the present invention. As shown in FIG. 2A, the composite structure 3 comprises an electronic component 31 and a supporting member 32. The electronic component 31 comprises a main body 311 and a plurality of pins 312. The pins 312 are extended outwardly from the main body 311 of the electronic component 31. The supporting member 32 comprises a first supporting part 321 and a second supporting part 322. The first supporting part 321 is foldable with respect to the second supporting part 322. The main body 311 of the electronic component 31 could be accommodated within the first supporting part 321 of the supporting member 32. The pins 312 could be accommodated with the second supporting part 322 of the supporting member 32. In a case that the first supporting part 321 is folded with respect to the second supporting part 322, the pins 312 are bent to define a bent structure 313 (see FIG. 2D). As a consequence, the position of the main body 311 of the electronic component 31 is adjustable.

Figure 2B:
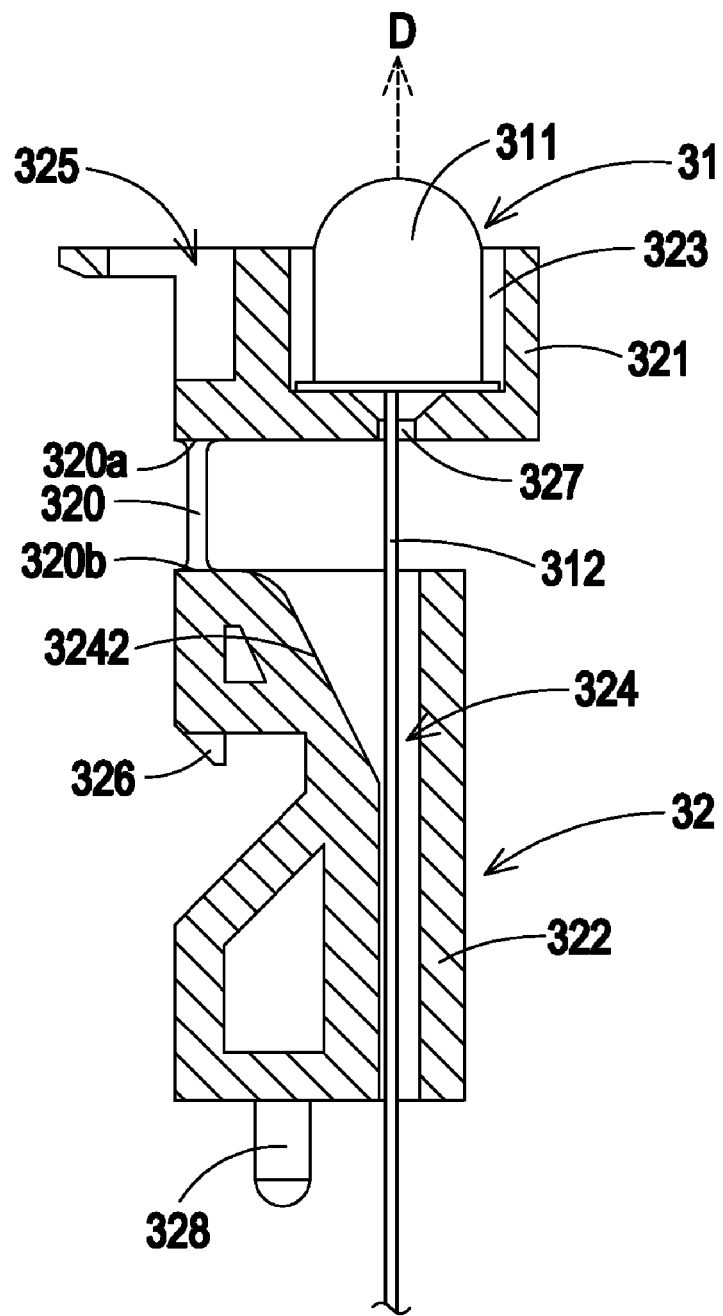
FIG. 2B is a schematic cross-sectional view illustrating the assembled composite structure of FIG. 2A taken along the line a-a'.

FIG. 2B is a schematic cross-sectional view illustrating the assembled composite structure of FIG. 2A taken along the line a-a'. Please refer to FIGS. 2A and 2B. The electronic component 31 comprises a main body 311 and a plurality of pins 312. The pins 312 are extended outwardly from the main body 311 of the electronic component 31. In this embodiment, the electronic component 31 is a LED package. That is, the main body 311 includes a LED chip (not shown) that is encapsulated by transparent packaging material (e.g. epoxy resin). The pins 312 are made of conductive material. The number of pins 312 is two or more than two. The detailed configurations of the electronic device 31 are similar to those of the LED package 11, and are not redundantly described herein. The electronic component 31 is not restricted to the LED package as long as the electronic component has the main body and the pins. Another example of the electronic component 31 includes but is not limited to a passive component such as a resistor (e.g. a NTC thermistor), a capacitor, an inductor, or the like.

Figure 2C:
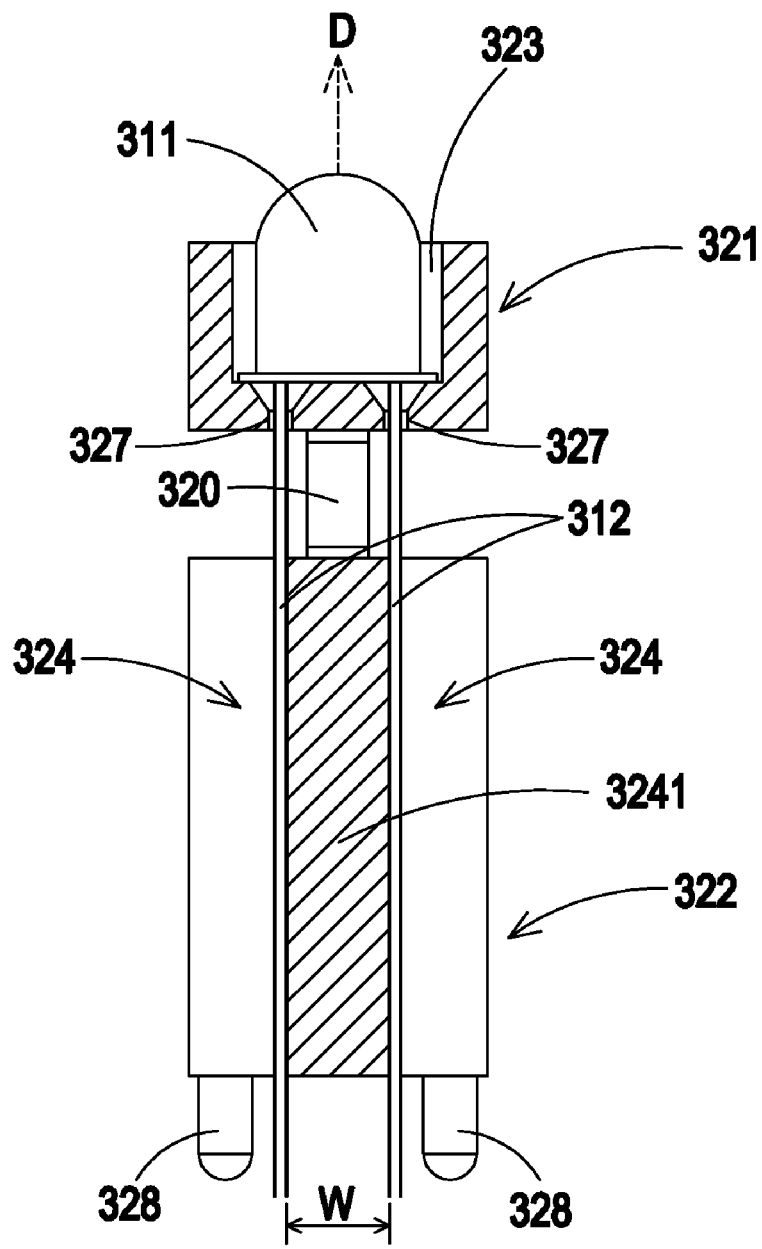
FIG. 2C is a schematic cross-sectional view illustrating the assembled composite structure of FIG. 2A taken along the line b-b'.

FIG. 2C is a schematic cross-sectional view illustrating the assembled composite structure of FIG. 2A taken along the line b-b'. Please refer to FIGS. 2A, 2B and 2C. In addition to the electronic component 31 and the supporting member 32, the supporting member 32 further comprises a connecting part 320. The connecting part 320 is arranged between the first supporting part 321 and the second supporting part 322. The connecting part 320 is a slab. The connecting part 320 has a first terminal 320a and a second terminal 320b. The first terminal 320a is coupled with the first supporting part 321. The second terminal 320b is coupled with the second supporting part 322. Via the connecting part 320, the first supporting part 321 is connected with the second supporting part 322. In an embodiment, the first supporting part 321, the connecting part 320 and the second supporting part 322 of the supporting member 32 are made of insulating material such as plastic material. It is preferred that the first supporting part 321, the connecting part 320 and the second supporting part 322 of the supporting member 32 are integrally formed. The connecting part 320 is made flexible. By using the second terminal 320b of the connecting part 320 as a fulcrum, the first supporting part 321 is folded with respect to the second supporting part 322 (see FIG. 2D).

The first supporting part 321 of the supporting member 32 further comprises a receptacle 323 and a first engaging element 325. The shape and size of the receptacle 323 mate with the main body 311 of the electronic component 31, so that the main body 311 could be partially accommodated within the receptacle 323. In addition, the first supporting part 321 further comprises a plurality of perforations 327. The perforations 327 are formed in the bottom surface of the first supporting part 321 and communicate with the receptacle 323. The number of perforations 327 is dependent on the number of pins 312 of the electronic component 31. In this embodiment, the electronic component 31 has two pins 312, and the first supporting part 321 of the supporting member 32 has two perforations (see FIG. 2C). An example of the first engaging element 325 includes but is not limited to a fastening slot.

Please refer to FIGS. 2A, 2B and 2C again. The second supporting part 322 of the supporting member 32 comprises a plurality of guiding grooves 324, a second engaging element 326 and a fixing element 328. In this embodiment, the guiding grooves 324 are formed in two opposite surfaces of the second supporting part 322. The number of guiding grooves 324 is dependent on the number of pins 312 of the electronic component 31. In this embodiment, the second supporting part 322 has two guiding grooves 324. In addition, these guiding grooves 324 are separated from each other by a spacer 3241 having a width W (see FIG. 2C).

For facilitating guiding the pins 312 of the electronic component 31, a guiding slant 3242 is formed in a sidewall of each guiding groove 324. The second engaging element 326 and the first engaging element 325 have complementary shapes. In this embodiment, the first engaging element 325 is a fastening slot (see FIGS. 2A and 2B) and the second engaging element 326 is a protruding block (see FIG. 2B), so that the first engaging element 325 and the second engaging element 326 could be engaged with each other. It is noted that, however, those skilled in the art will readily observe that numerous modifications and alterations may be made while retaining the teachings of the invention. For example, in some embodiments, the first engaging element 325 is a protruding block, and the second engaging element 326 is a fastening slot. Moreover, the position of the second engaging element 326 is determined according to the practical requirements. In this embodiment, the second engaging element 326 is a protruding block that is vertically extended from a bottom of the supporting member 32 (see FIG. 2B).

Figure 2D:
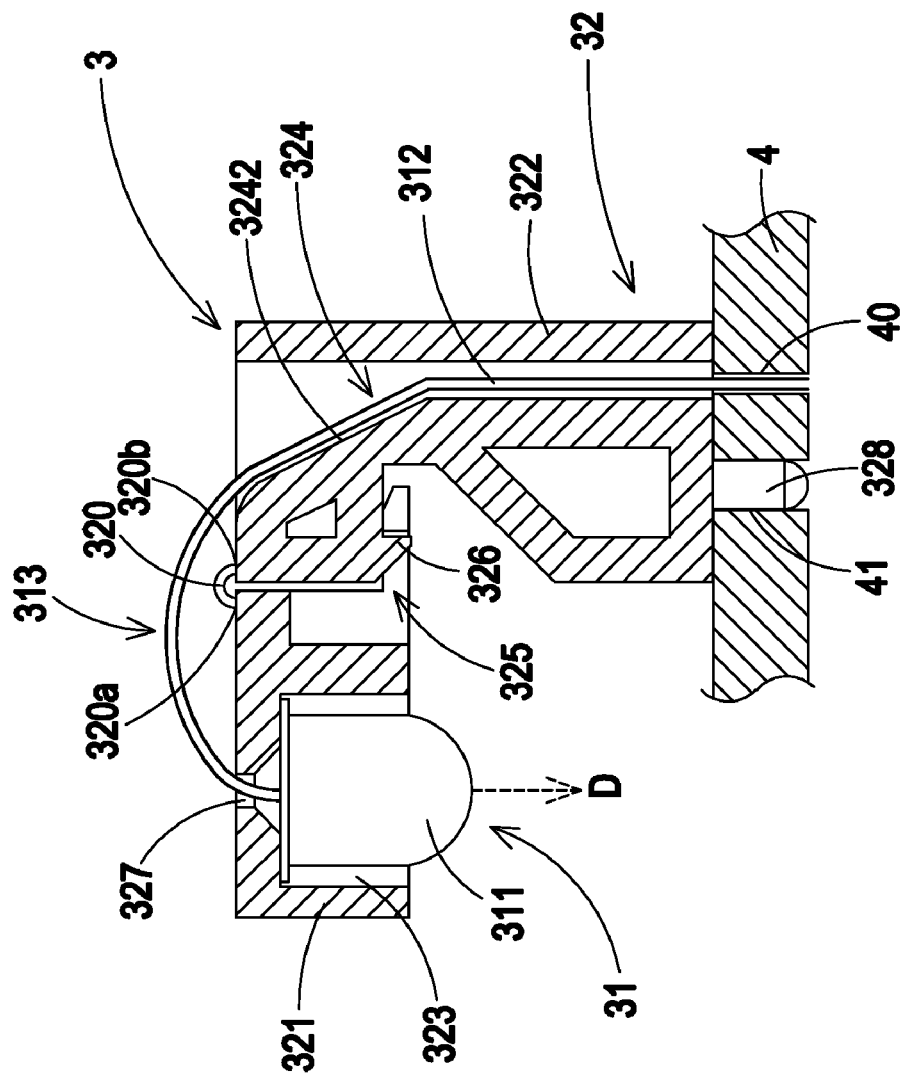
FIG. 2D is a schematic cross-sectional view illustrating that the first supporting part is folded with respect to the second supporting part.

FIG. 2D is a schematic cross-sectional view illustrating that the first supporting part is folded with respect to the second supporting part. Hereinafter, a process of assembling the electronic component 31 and the supporting member 32 will be illustrated with reference to FIGS. 2A, 2B, 2C and 2D.

First of all, the main body 311 of the electronic component 31 is partially accommodated within the receptacle 323 of the first supporting part 321 of the supporting member 32. As such, the main body 311 of the electronic component 31 is embedded into the first supporting part 321 of the supporting member 32, and the pins 312 of the electronic component 31 penetrate through corresponding perforations 327. With the assistance of the guiding slant 3242, the pins 312 are introduced into and partially accommodated within the guiding grooves 324. During the pins 312 are introduced into the guiding grooves 324, the pins 312 could be sustained against the spacer 3241. As such, the spacing interval between the pins 312 is fixed according to the width W of the spacer 3241 (see FIG. 2C).

Next, the first supporting part 321 of the supporting member 32 is folded with respect to the second supporting part 322, so that the connecting part 320 and the pins 312 are both bent. As the pins 312 are bent, a bent structure 313 is defined and the position of the main body 311 of the electronic component 31 is changed (see FIG. 2D). In a case that the first supporting part 321 of the supporting member 32 is folded with respect to the second supporting part 322 by 180 degrees, the pins 312 are bent to define the bent structure 313. Under this circumstance, the projecting direction D of the light beams emitted by the main body 311 of the electronic component 31 (e.g. a LED package) is switched from the upward direction (see FIG. 2B) to the downward direction (see FIG. 2D). Due to engagement between the first engaging element 325 (e.g. a fastening slot) and the second engaging element 326 (e.g. a protruding block), the first supporting part 321 is positioned on the second supporting part 322, and the angle between the first supporting part 321 and the second supporting part 322 is fixed. Meanwhile, the bent structure 313 is kept stationary, and the main body 311 of the electronic component 31 is located at a predetermined position. Moreover, the pins 312 of the electronic component 31 could be attached on the guiding slant 3242 in order to reduce the length of the pins 312.

The fixing element 328 is extended from the bottom surface of the second supporting part 322. After the composite structure 3 of the electronic component 31 and the supporting member 32 is assembled (see FIG. 2D), the fixing element 328 is inserted into a corresponding fixing hole 41 of the circuit board 4 in order to initially fix the supporting member 32 on the circuit board 4. At the same time, the pins 312 of the electronic component 31 are inserted into corresponding conductive through-holes 40 of the circuit board 4. Since the spacing interval between the pins 312 is fixed according to the width W of the spacer 3241, the pins 312 could be precisely inserted into corresponding conductive through-holes 40 of the circuit board 4 and electrically connected to the circuit board 4. Moreover, since the electronic component 31 is supported by the supporting member 32 and the fixing element 328 of the supporting member 32 is inserted into a corresponding fixing hole 41 of the circuit board 4, the electronic component 31 could be structurally and electrically connected with the circuit board 4.

Figure 3:
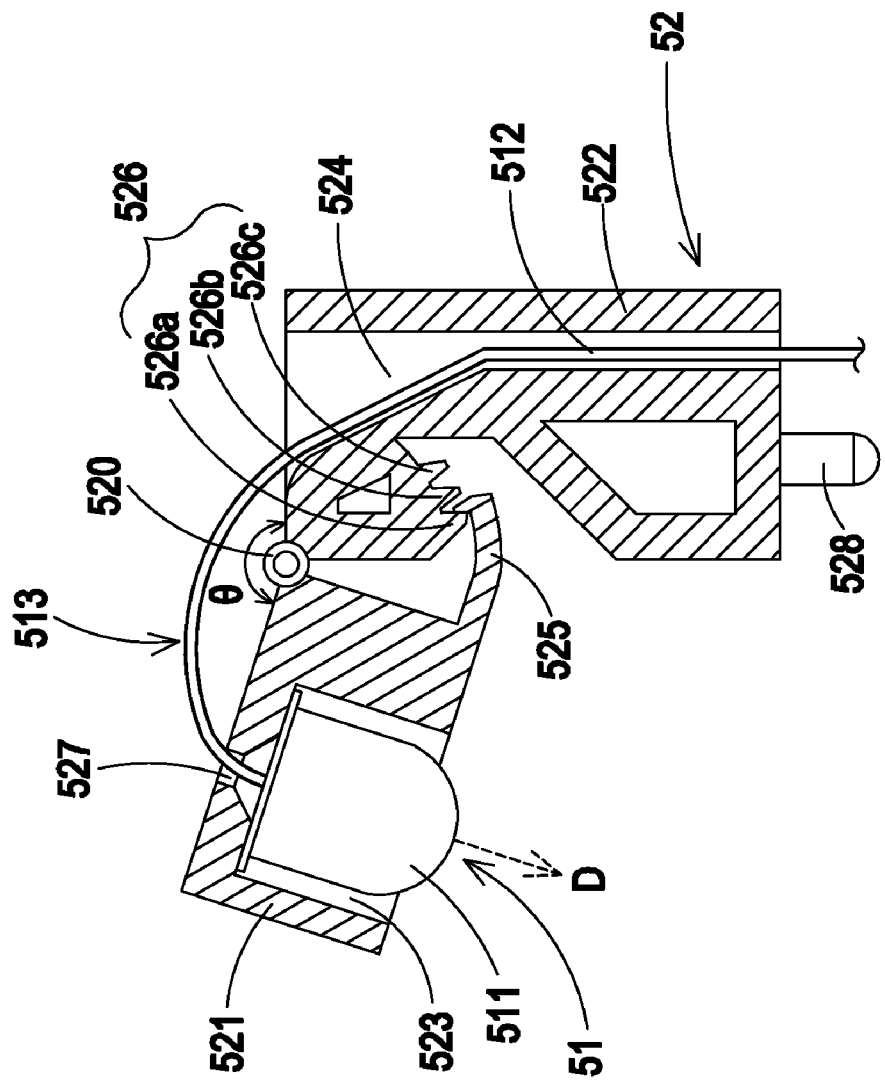
FIG. 3 is a schematic cross-sectional view illustrating a composite structure according to a second embodiment of the present invention.

FIG. 3 is a schematic cross-sectional view illustrating a composite structure according to a second embodiment of the present invention. As shown in FIG. 3, the composite structure 5 comprises an electronic component 51 and a supporting member 52. The electronic component 51 comprises a main body 511 and a plurality of pins 512. The pins 512 are extended outwardly from the main body 511 of the electronic component 51. The configurations of the electronic component 51 are similar to those of FIGS. 2A~2D, and are not redundantly described herein. The supporting member 52 comprises a first supporting part 521 and a second supporting part 522. The first supporting part 521 is foldable with respect to the second supporting part 522.

Please refer to FIG. 3 again. The first supporting part 521 of the supporting member 52 comprises a receptacle 523, a first engaging element 525 and a plurality of perforations 527. The second supporting part 522 of the supporting member 52 comprises a plurality of guiding grooves 524, a second engaging element 526 and a fixing element 528. The first supporting part 521 and the second supporting part 522 are individual elements. A connecting part 520 is arranged between the first supporting part 521 and the second supporting part 522. In this embodiment, the connecting part 520 is a hinge. Via the connecting part 520, the first supporting part 521 is connected with the second supporting part 522, and the first supporting part 521 is foldable with respect to the second supporting part 522. In this embodiment, the first engaging element 525 is an arc-shaped hook, which is extended outwardly from the first supporting part 521. Corresponding to the arc-shaped hook 525, the second engaging element 526 comprises a plurality of protruding blocks. In this embodiment, the protruding blocks comprises a first protruding block 526a, a second protruding block 526b and a third protruding block 526c, which are successively formed on an arc-shaped surface. The shape of curve surface of the second engaging element 526 mates with the shape of the arc-shaped hook 525.

After the electronic component 51 is assembled with the supporting member 52, the first supporting part 521 of the supporting member 52 is folded with respect to the second supporting part 522 by a desired angle θ. Due to engagement between the first engaging element 525 and the second engaging element 526, the first supporting part 521 is positioned on the second supporting part 522, and the angle between the first supporting part 521 and the second supporting part 522 is fixed. According to the practical requirements, the first engaging element 525 could be engaged with the first protruding block 526a, the second protruding block 526b and the third protruding block 526c of the second engaging element 526. As such, the angle θ between the first engaging element 525 and the second engaging element 526 is adjustable. In other words, the first supporting part 521 is foldable with respect to the second supporting part 522 in a multi-angular manner. It is noted that, however, those skilled in the art will readily observe that the number of protruding blocks could be increased as required. The configurations and functions of the receptacle 523 and the perforations 527 of the first supporting part 521 and the guiding grooves 524 and the fixing element 528 are similar to those shown in FIG. 2, and are not redundantly described herein.

Since the second engaging element 526 of the second supporting part 522 comprises a plurality of protruding blocks, the bending structure 513 could have different bending degrees when the first engaging element 525 is engaged with different protruding blocks of the second engaging element 526. As such, the main body 511 of the electronic component 51 is adjusted in a multi-angular manner. In a case that the electronic component 51 is a LED package, various projecting directions D of the light beams emitted by the main body 511 of the electronic component 51 could be selected.

Figure 4:
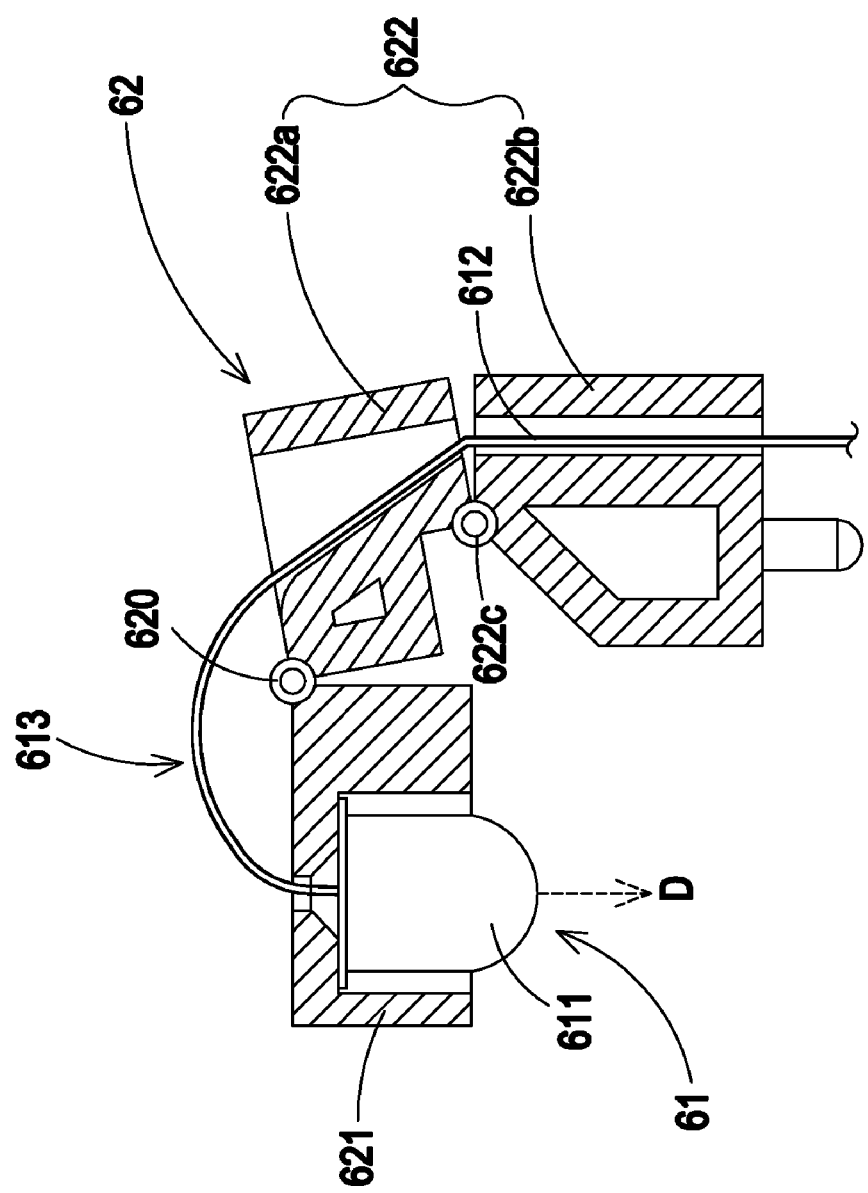
FIG. 4 is a schematic cross-sectional view illustrating a composite structure according to a third embodiment of the present invention.

FIG. 4 is a schematic cross-sectional view illustrating a composite structure according to a third embodiment of the present invention. As shown in FIG. 4, the composite structure 6 comprises an electronic component 61 and a supporting member 62. The electronic component 61 comprises a main body 611 and a plurality of pins 612. The pins 612 are extended outwardly from the main body 611 of the electronic component 61. A first connecting part 620 is arranged between the first supporting part 621 and the second supporting part 622. In this embodiment, the connecting part 620 is a hinge. Via a first connecting part 620, the first supporting part 621 is connected with the second supporting part 622, and the first supporting part 621 is foldable with respect to the second supporting part 622. In this embodiment, the second supporting part 622 of the supporting member 62 further comprises a first segment 622a and a second segment 622b. The first segment 622a is arranged between the first supporting part 621 and the second segment 622b. A second connecting part 622c is arranged between the first segment 622a and the second segment 622b. Via the second connecting part 622c, the first segment 622a is foldable with respect to the second segment 622b.

In this embodiment, the first connecting part 620 and the second connecting part 622c are free-stop hinges. By means of the first connecting part 620 and the second connecting part 622c, the first supporting part 621 is foldable with respect to the second supporting part 622 and the first segment 622a is foldable with respect to the second segment 622b. Since the electronic component 61 is supported by the supporting member 62 and the fixing element of the supporting member 62 is inserted into a corresponding fixing hole 41 of the circuit board 4, the electronic component 61 could be structurally and electrically connected with the circuit board 4. When the first supporting part 621 is folded with respect to the second supporting part 622, the pins 612 are bent to define a bent structure 613, and thus the position of the main body 611 of the electronic component 61 is adjustable. Moreover, since the first segment 622a is foldable with respect to the second segment 622b, the process of mounting the electronic component 61 on the circuit board 4 has enhanced flexibility.

In the above embodiments, the supporting member has diverse configurations. For example, the first engaging element of the first supporting part and the second engaging element of the second supporting part are respectively a fastening slot and a protruding block (see FIG. 2D). Alternatively, the first engaging element of the first supporting part and the second engaging element of the second supporting part are respectively a hook and a protruding block (see FIG. 3). In a case that the first supporting part is not returned to the original position after the first supporting part is folded, the first engaging element of the first supporting part and the second engaging element of the second supporting part could be omitted.

Moreover, the main body of the electronic device could be fixed at a fixed position after the first supporting part is folded with respect to the second supporting part (see FIG. 2D). Alternatively, the main body of the electronic component could be adjusted in a multi-angular manner (see FIG. 3) or a multi-stage manner (see FIG. 4). In some embodiments, the first supporting part, the connecting part and the second supporting part of the supporting member are integrally formed (see FIG. 2D). Alternatively, the first supporting part and the second supporting part are individual elements, which are connected with each other via connecting parts (see FIGS. 3 and 4). The number of pins of the electronic components is varied according to the practical requirements. It is preferred that these pins are extended outwardly from the main body and arranged in a line. The numbers of perforations and guiding grooves are dependent on the number of pins. The main body of the electronic component is supported by the supporting member. When the first supporting part is folded with respect to the second supporting part, the pins are bent to define a bent structure.

From the above description, since the electronic component is supported by the supporting member, the electronic component could be structurally and electrically connected with the circuit board in a more reliable manner. Moreover, the pins are bent to define a bent structure when the first supporting part is folded with respect to the second supporting part, so that the position of the electronic component with respect to the circuit board could be flexibly adjustable. In other words, the composite structure of the present invention could obviate the drawbacks encountered from the prior art.

By adjusting the angle between the first supporting part and the second supporting part, the pins are bent to define various bent structures such that the main body of the electronic component could be located at different positions. Due to engagement between the first engaging element and the second engaging element, the first supporting part is positioned on the second supporting part, and the angle between the first supporting part and the second supporting part is fixed. With the assistance of the guiding slant, the pins are introduced into and partially accommodated within the guiding grooves. Since the spacing interval between the pins is fixed according to the width of the spacer, the pins could be precisely inserted into corresponding conductive through-holes of the circuit board.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A composite structure comprising:
an electronic component comprising a main body and a plurality of pins extended outwardly from said main body; and
a supporting member comprising a first supporting part and a second supporting part, said first supporting part being foldable with respect to said second supporting part, wherein said main body of said electronic component is accommodated within said first supporting part of said supporting member, said pins are accommodated within said second supporting part of said supporting member, and said first supporting part is folded with respect to said second supporting part such that said pins are bent to define a bent structure.

2. The composite structure according to claim 1 wherein said supporting member further comprises a connecting part between said first supporting part and said second supporting part.

3. The composite structure according to claim 2 wherein said supporting member is made of insulating material, and said the first supporting part, said connecting part and said second supporting part of said supporting member are integrally formed.

4. The composite structure according to claim 1 wherein said first supporting part of said supporting member further comprises:
a receptacle for partially accommodating said main body of said electronic component;
a plurality of perforations communicating with said receptacle and aligned with said pins, wherein said pins penetrate through corresponding perforations; and
a first engaging element.

5. The composite structure according to claim 4 wherein said second supporting part of said supporting member further comprises:
a plurality of guiding grooves for accommodating said pins of said electronic component; and
a second engaging element to be engaged with said first engaging element.

6. The composite structure according to claim 5 wherein said first engaging element includes a fastening slot, and said second engaging element includes a protruding block.

7. The composite structure according to claim 5 wherein said first engaging element includes a hook, and said second engaging element includes a plurality of protruding blocks.

8. The composite structure according to claim 1 wherein said second supporting part of said supporting member further comprises a fixing element to be inserted into a fixing hole of a circuit board such that said supporting member is fixed on said circuit board, and said pins of said electronic component are electrically connected with said circuit board.

9. The composite structure according to claim 1 wherein said second supporting part of said supporting member further comprises a first segment and a second segment, wherein said first segment is foldable with respect to said second segment.

10. The composite structure according to claim 1 wherein said electronic component is a LED package, a resistor, a capacitor, or an inductor.

11. A supporting member for supporting an electronic component, said electronic component comprising a main body and a plurality of pins extended outwardly from said main body, said supporting member comprising:
    a first supporting part for accommodating said main body of said electronic component; and
    a second supporting part for accommodating said pins of said electronic component, wherein said first supporting part is folded with respect to said second supporting part such that said pins are bent to define a bent structure.

12. The supporting member according to claim 11 wherein said supporting member further comprises a connecting part between said first supporting part and said second supporting part.

13. The supporting member according to claim 12 wherein said supporting member is made of insulating material, and said the first supporting part, said connecting part and said second supporting part of said supporting member are integrally formed.

14. The supporting member according to claim 11 wherein said first supporting part of said supporting member further comprises:
    a receptacle for partially accommodating said main body of said electronic component;
    a plurality of perforations communicating with said receptacle and aligned with said pins, wherein said pins penetrate through corresponding perforations; and
    a first engaging element.

15. The supporting member according to claim 14 wherein said second supporting part of said supporting member further comprises:
    a plurality of guiding grooves for accommodating said pins of said electronic component; and
    a second engaging element to be engaged with said first engaging element.

16. The supporting member according to claim 15 wherein said first engaging element includes a fastening slot, and said second engaging element includes a protruding block.

17. The supporting member according to claim 15 wherein said first engaging element includes a hook, and said second engaging element includes a plurality of protruding blocks.

18. The supporting member according to claim 11 wherein said second supporting part of said supporting member further comprises a fixing element to be inserted into a fixing hole of a circuit board such that said supporting member is fixed on said circuit board, and said pins of said electronic component are electrically connected with said circuit board.

19. The supporting member according to claim 11 wherein said second supporting part of said supporting member further comprises a first segment and a second segment, wherein said first segment is foldable with respect to said second segment.

20. The supporting member according to claim 11 wherein said electronic component is a LED package, a resistor, a capacitor, or an inductor.

\* \* \* \* \*